United States Patent [19]

Chan

[11] Patent Number: 5,525,823
[45] Date of Patent: Jun. 11, 1996

[54] MANUFACTURE OF CMOS DEVICES

[75] Inventor: Tsiu C. Chan, Carrollton, Tex.

[73] Assignee: SGS-Thomson Microelectronics, Inc., Carrollton, Tex.

[21] Appl. No.: 242,257

[22] Filed: May 13, 1994

Related U.S. Application Data

[63] Continuation of Ser. No. 884,264, May 8, 1992, abandoned.

[51] Int. Cl.$^6$ .............................. H01L 29/76; H01L 21/04
[52] U.S. Cl. ........................ 257/369; 257/375; 257/376; 257/398; 257/506; 437/15; 437/29; 437/57; 437/63; 437/235
[58] Field of Search ..................................... 257/369, 375, 257/376, 398, 506; 437/15, 29, 57, 63, 235

[56] References Cited

U.S. PATENT DOCUMENTS

| | | | |
|---|---|---|---|
| 3,576,498 | 4/1971 | Hirsch | 331/14 |
| 3,673,471 | 6/1972 | Klein et al. | 317/235 |
| 4,242,691 | 12/1980 | Kotani et al. | 357/23 |
| 4,354,307 | 10/1982 | Vinson et al. | 29/571 |
| 4,435,896 | 3/1984 | Parrillo et al. | 29/571 |
| 4,549,340 | 10/1985 | Nagasawa et al. | 29/571 |
| 4,731,343 | 3/1988 | Beinvogel | 437/63 |
| 4,889,825 | 12/1989 | Parrillo | 437/34 |
| 4,929,565 | 5/1990 | Parrillo | 257/369 |

FOREIGN PATENT DOCUMENTS

| | | |
|---|---|---|
| 0178440 | 4/1986 | European Pat. Off. |
| 0197198 | 10/1986 | European Pat. Off. |
| 2533749 | 3/1984 | France |

OTHER PUBLICATIONS

Carr et al., "The (111) Standard Process (p–Channel Enhancement Mode)," MOS/LSI Design and Application, p. 65, McGraw–Hill (1972). Jan. 1972.

J. C. Sarace, et al., "Metal–Nitride–Oxide–Silicon Field–Effect Transistors, with Self–Aligned Gates," Solid–State Electronics, II, p. 653 (1968). Jan. 1968.

Sunami, "Characteristics of a Buried–Channel Graded Drain with Punchthrough Stopper (BGP) MOS Device," IEEE Transactions on Electron Devices, Ed–29, No. 4 (1982). Apr.

P. P. Wang, "Double Boron Implant Short–Channel MOSFET," IEEE Transactions on Electron Devices, Ed–24, No. 3, p. 196 (1977). Mar.

Dennard et al., "Ion Implanted MOSFETs with Very Short Channel Lengths," IEDM, p. 152 (1973). Jan.

Tsai, "A New Twin–Well CMOS Process Using Nitridized–Oxide–LOCOS (NOLOCOS) Isolation Technology," IEEE Transactions on Electron Devices, vol. 10, No. 7 (1989). Jul.

Nishihara et al., "A 0.5 μm. Isolation Technology Using Advanced Poly Silicon Pad LOCOS (APPL)," IEDM, p. 100 (1988). Jan.

Parrillo et al., "A Versatile, High–Performance, Double–Level–Poly Double–Level–Metal, 1.2–Micron CMOS Technology," IEDM, p. 244 (1986). Jan.

Parrillo et al., "Twin–Tub CMOS—A Technology for VLSI Circuits," IEEE, p. 752 (1980). Jan.

Chen et al., "A High Performance Submicron CMOS Process with Self–Aligned Chan–Stop and Punch–Through Implants (Twin–Tub V)," IEDM, p. 256 (1986). Jan.

VLSI Technology (ed. Sze 1983). p. 466—Jan.

Wang et al., "Direct–Moat Isolation for VLSI," IEEE Trans'ns Electro Devices 541–547 (1982) Apr.–1982.

*Primary Examiner*—Edward Wojciechowicz
*Attorney, Agent, or Firm*—Kenneth C. Hill; Robert Groover; Lisa K. Jorgenson

[57] ABSTRACT

A method for forming field oxide regions on an integrated circuit device includes the steps of providing doped regions for formation of active devices. After the doped regions have been formed, a thick field oxide layer is grown over the entire surface of the device. Field oxide regions are then defined using masking and anisotropic etching steps which provide approximately vertical sidewalls for the field oxide regions, and which do not result in the formation of bird's beaks. Since the active regions are defined prior to formation of the field oxide regions, the active regions extend under the field oxide regions and do not give rise to edge effects.

27 Claims, 2 Drawing Sheets

MANUFACTURE OF CMOS DEVICES

This is a continuation application of application Ser. No. 07/884,264, filed May 8, 1992, now abandoned.

BACKGROUND OF THE INVENTION

1. Field of the Invention

The present invention relates generally to semiconductor integrated circuits, and more specifically to a method for manufacturing complementary field effect devices (CMOS) in an integrated circuit.

2. Description of the Prior Art

In general, the industry continues to try to make integrated circuit devices smaller. Smaller chips, in general, are less expensive and often provide better performance. However, various problems related to the physical size of components on the integrated circuit become important as devices are scaled to smaller and smaller sizes.

Currently, local oxidation techniques are used to form field oxide regions between devices. Such techniques are often referred to as LOCal Oxidation of Silicon (LOCOS). In general, these techniques provide for covering active areas of the semiconductor chip with a protective oxide/nitride layer. This layer is removed where field oxide regions are to be grown, and a high temperature oxide is grown on the device. Oxide grows in the exposed regions, and not under the nitride layer. This technique causes the formation of the well known "bird's beak", which extends partway into the active areas surrounding the field oxide region.

As device scales continue to shrink, problems are encountered as a result of the bird's beak phenomenon. Various edge effects occur in channel regions located adjacent the bird's beak, which can cause significant performance problems in narrow width transistors. In order to avoid these edge effects, transistors cannot generally be made smaller than certain minimum sizes. These minimum allowable transistor sizes place limits on the spacing of devices within the integrated circuit, thereby limiting the device scaling which can be realized.

It would be desirable to provide a method for forming field oxide regions within an integrated circuit which does not cause edge effects within adjacent field effect devices, thereby allowing additional shrinkage in device feature sizes.

SUMMARY OF THE INVENTION

Therefore, in accordance with the present invention, a method for forming field oxide regions on an integrated circuit device includes the steps of providing doped regions for formation of active devices. After the doped regions have been formed, a thick field oxide layer is grown over the entire surface of the device. Field oxide regions are then defined using masking and anisotropic etching steps which provide approximately vertical sidewalls for the field oxide regions, and which do not result in the formation of bird's beaks. Since the active regions are defined prior to formation of the field oxide regions, the active regions extend under the field oxide regions and do not give rise to edge effects.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
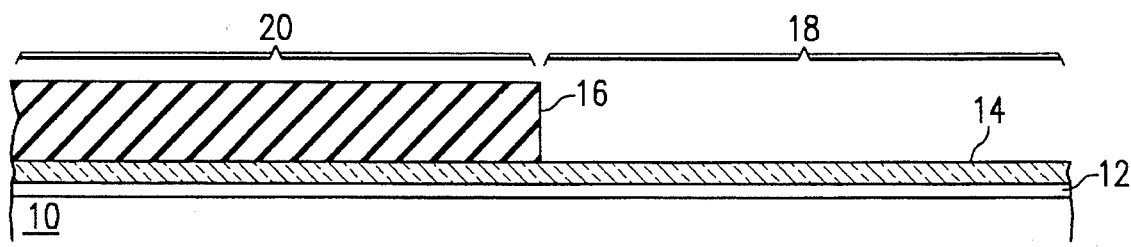
FIGS. 1–8 illustrate a preferred method for forming semiconductor structures according to the present invention.

Referring to FIG. 1, integrated circuit devices are to be fabricated in a substrate 10. Although various substrate types can be used, for the preferred embodiment described herein an N-type substrate having an impurity concentration of approximately $10^{14}$ to $5\times10^{15}$ atoms/cm$^3$ is used. The substrate 10 preferably has a <100> crystal orientation.

A pad oxide layer 12 is thermally grown over the substrate 10, followed by deposition of a silicon nitride layer 14. A layer of photoresist 16 is then deposited over the device, and patterned to expose regions 18 in which N-wells will be formed. The remaining resist regions 16 remain over regions 20 in which P-wells will be formed.

Figure 2:
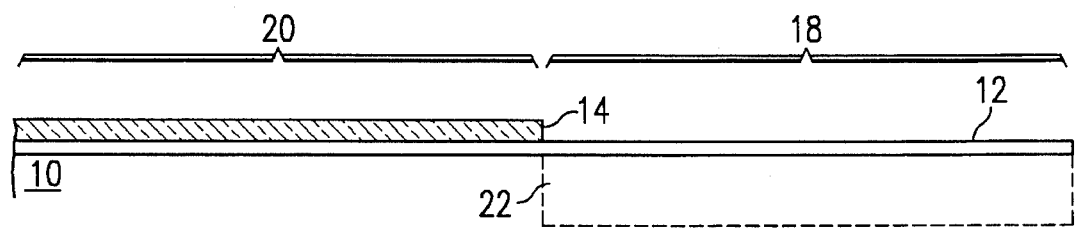

Referring to FIG. 2, the nitride layer 14 is removed over the N-well regions, using the photoresist layer 16 as a mask. In the preferred embodiment, phosphorous is implanted at a dosage of $6\times10^{12}$ atoms/cm$^2$ at 150 KeV. In conjunction with later processing steps, this dosage provides the desired field threshold voltages $V_{Tfp}$. After the N-well implant, the photoresist layer 16 is removed.

Figure 3:
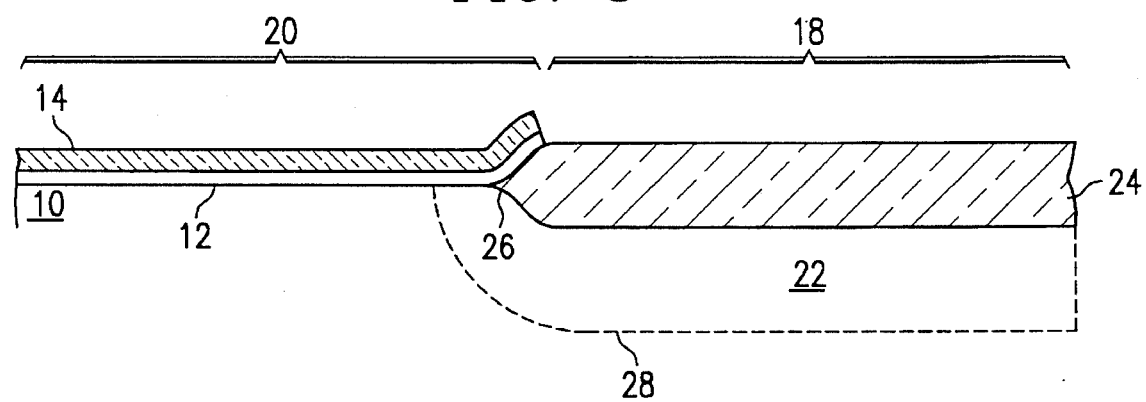
Figure 4:
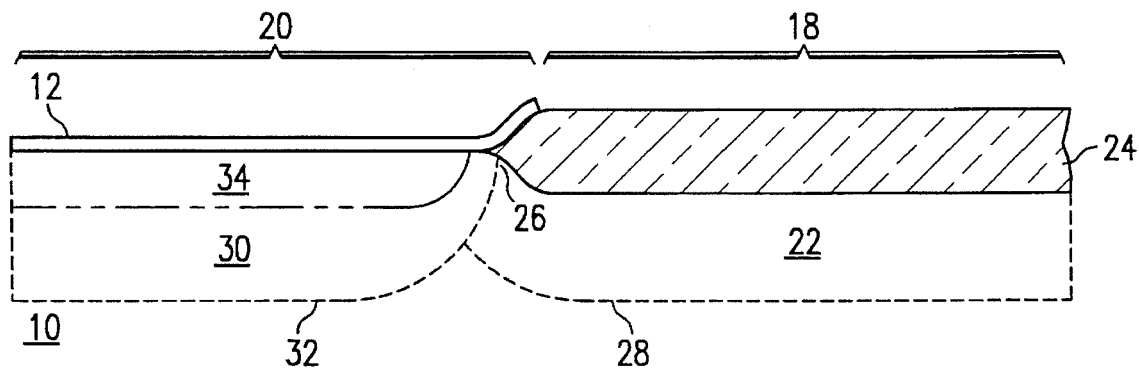

Referring to FIG. 3, a field oxide region 24 is then thermally grown in the N-well region 18. The nitride layer 14 acts as a mask to prevent formation of field oxide within the P-well region 20 as is known in the art. The field oxide 24 is preferably grown to a thickness of at least approximately 5000 angstroms. As known in the art, the field oxide 24 will grown down into the substrate 10 as well as above it, and a bird's beak 26 will be formed. This oxide growth step causes the N-well junction 28 to move from its initial location, diffusing down into the substrate and laterally into the edge of the P-well region Referring to FIG. 4, the remaining portions of the nitride layer 14 are removed. A blanket P-well implant is then made to define the P-well. Preferably, boron is implanted at a dose of $2.5\times10^{12}$ atoms/cm$^2$ at a power of 50 KeV. This is followed by a heating step to drive the P-well junction 32 to a depth of approximately three to four microns.

An N-channel implant is then made into the P-well 30 to form a region 34 suitable for the fabrication of N-channel transistors. Preferably, boron is implanted at a dosage of approximately $3\times10^{13}$ atoms/cm$^2$ at a energy of 50 KeV to provide the desired field threshold voltage $V_{Tfn}$. The thick field oxide layer 24 protects the N-well region 18 during both of these boron implantation steps.

Figure 5:
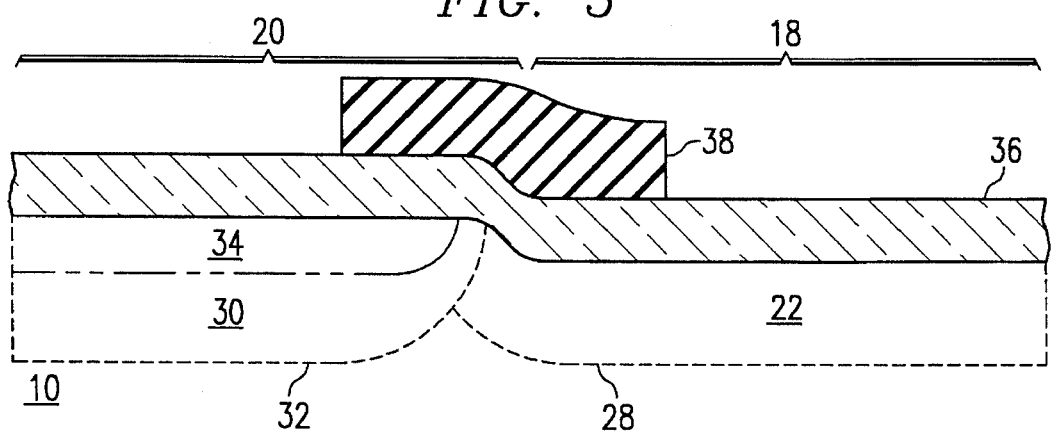

Referring to FIG. 5, all oxide layers are removed. A layer of field oxide 36 is thermally grown over the entire device, preferably to a thickness of approximately 4000 angstroms.

A layer of photoresist 38 is then deposited over the field oxide layer 36, and patterned as shown to define regions where field oxide is to remain on the finished device.

Figure 6:
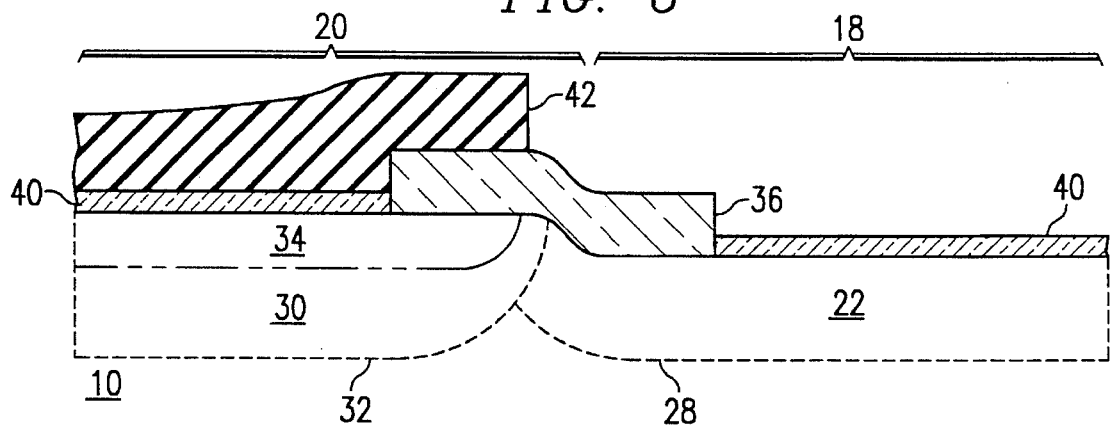

Referring to FIG. 6, the field oxide 36 is etched using the patterned resist 38 as a mask, which is then removed. This leaves regions of field oxide 36 in desired locations on the device. As known in the art, field oxide 36 is typically left in all areas in which N-well regions 18 and P-well regions 20 are adjacent. Field oxide 36 is also left to separate devices in the same type of well.

After removal of the photoresist 38, a layer of oxide 40 is grown to remove damaged silicon at the surface of the active areas. This layer is often referred to as a sacrificial layer. A blanket implant is then made to adjust the $V_{Tn}$ and $V_{Tp}$ for the device so that $V_{Tn}$ is adjusted to the correct value. A layer of photoresist 42 is then formed over the device and patterned to expose the active areas within the N-well regions 20. A masked implant is then performed to adjust $V_{Tp}$ to the correct value.

Figure 7:
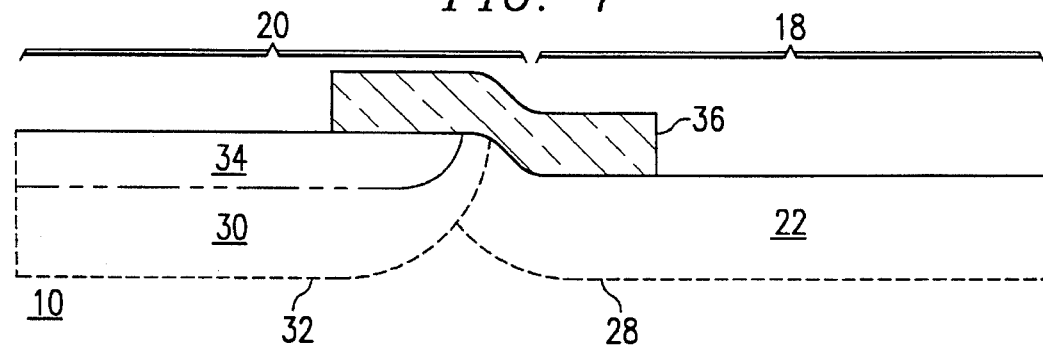

Referring to FIG. 7, the resist layer 42 is removed, followed by removal of the oxide layer 40. This results in the structure shown in FIG. 7. All P-wells 20 and N-wells 18 have been defined. The field oxide regions 36 have been defined, and the threshold voltages have been adjusted where necessary. The integrated circuit device is now ready for the formation of CMOS devices and interconnect. These following process steps generally begin with the growth of a gate oxide layer (not shown), followed by additional steps as known in the art.

Figure 8:
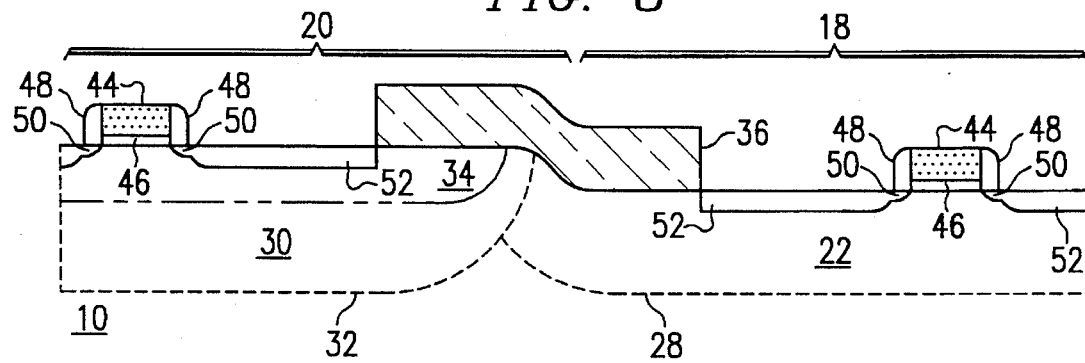

FIG. 8 illustrates the device at a later stage of fabrication. Techniques for forming the devices shown are conventional. Transistor gates 44 are formed over gate oxide 46. Sidewall oxide spacers 48 allow the formation of lightly doped drain regions 50 adjacent the source/drain regions 52. Later interlevel oxide layers and interconnect layers are not shown, and are formed as known in the art.

The method described above results in the formation of field oxide regions which do not have the bird's beak structures characteristic of local oxidation processes. The P-well and N-well regions 20, 18 extend under the field oxide 36, so that no transition occurs at the edges. This minimizes the edge effects which tend to become more pronounced at small feature sizes. This means that transistors can be made smaller than before, resulting in increased device density.

With the thin gate oxides used in the described method, only a very light $V_T$ adjust implant needs to be made for the N-channel devices. The surface dopant concentrations for the channels of the N-channel devices is therefore very close to that for the parasite field devices under the field oxide. Since there is no large change in dopant concentrations at the edges of the field oxide regions, edge effects due to sharp concentration gradients are minimized.

When using the described method, a fairly abrupt step occurs at the edges of the field oxide. One advantage of local oxidation processes is that the bird's beak which is formed provides a less abrupt step at the field oxide edges. With the current technique, various known techniques can be used to improve the step profile if desired. For example, sidewall oxide spacers can be formed alongside the field oxide regions. A reflowable glass can be planarized and etched back to round the bottom portions of the step. Various techniques are available if they are needed.

While the invention has been particularly shown and described with reference to a preferred embodiment, it will be understood by those skilled in the art that various changes in form and detail may be made therein without departing from the spirit and scope of the invention.

What is claimed is:

1. A method of forming a semiconductor integrated circuit structure, comprising the steps of:

implanting, in a single implant step, an N-type dopant into a selected portion of a substrate;

growing a first oxide layer over said selected portion of the substrate, while simultaneously driving said N-type dopant into said substrate to form an N-well having a substantially uniform dopant concentration;

implanting P-type dopant atoms into said substrate in regions not covered by said first oxide layer; and thereafter heating said substrate to drive said P-type dopant atoms to form a P-well region having a depth approximately equal to the depth of said N-well and having a first dopant concentration; and thereafter uniformly implanting additional P-type dopant atoms into said P-well region to form a surface region therein having a dopant concentration higher than said first dopant concentration;

removing said first oxide layer;

forming a second oxide layer over the surface of said substrate; and patterning and etching said second oxide layer to leave a field oxide region over adjacent portions of said P-well and said N-well; and growing an additional oxide, which is thinner than said second oxide, over areas of said substrate which are exposed by said second oxide layer, and thereafter removing said additional oxide;

whereby said step of growing and removing said additional oxide removes damaged material.

2. The method of claim 1, wherein the step of growing a first oxide layer comprises the steps of:

forming a nitride layer over the P-well region; and, heating the substrate in an oxidizing ambient to form a thermal oxide over the N-well.

3. The method of claim 1, wherein said substrate comprises silicon.

4. The method of claim 1, wherein said step of implanting P-type dopant atoms and said step of implanting additional P-type dopant atoms use approximately the same energy.

5. An integrated circuit fabricated by the method of claim 1.

6. A method for integrated circuit fabrication, comprising the steps of:

implanting an N-type dopant into a selected portion of a semiconductor substrate;

growing a first oxide layer over said selected portion of the substrate, while simultaneously driving said N-type dopant into said substrate to form an N-well having a substantially uniform dopant concentration;

implanting P-type dopant atoms into said substrate in regions not covered by said first oxide layer; and thereafter heating said substrate to drive said P-type dopant atoms thereinto to form a P-well region having a first dopant concentration;

after said heating step, uniformly implanting additional P-type dopant atoms into said P-well region to form a surface region therein having a dopant concentration higher than said first dopant concentration;

removing said first oxide layer;

forming a second oxide layer over the entire surface of said substrate; and patterning and etching said second oxide layer to leave a field oxide region over adjacent portions of said P-well and said N-well; and growing an additional oxide, which is thinner than said second oxide, over areas of said substrate which are exposed by said second oxide layer, and thereafter removing said additional oxide;

whereby said step of growing and removing said additional oxide removes damaged material.

7. The method of claim 6, wherein said substrate comprises silicon.

8. The method of claim 6, wherein said step of implanting P-type dopant atoms and said step of implanting additional P-type dopant atoms use approximately the same energy.

9. The method of claim 6, wherein said step of growing said first oxide layer comprises the preliminary substeps of depositing a silicon nitride layer, and etching said silicon nitride to expose said selected portion.

10. The method of claim 6, wherein said step of etching said second oxide layer uses anisotropic etching.

11. The method of claim 6, wherein said heating step forms said P-well region to have a depth approximately equal to the depth of said N-well.

12. An integrated circuit fabricated by the method of claim 6.

13. A method for integrated circuit fabrication, comprising the steps of:

implanting an N-type dopant into a selected portion of a semiconductor substrate;

growing a first oxide layer over said selected portion of the substrate, while simultaneously driving said N-type dopant into said substrate to form an N-well having a substantially uniform dopant concentration;

implanting P-type dopant atoms into said substrate in regions not covered by said first oxide layer; and thereafter heating said substrate to drive said P-type dopant atoms thereinto to form a P-well region having a first dopant concentration; and thereafter uniformly implanting additional P-type dopant atoms into said P-well region to form a surface region therein having a dopant concentration higher than said first dopant concentration;

removing said first oxide layer;

forming a second oxide layer over the surface of said substrate;

patterning and etching said second oxide layer to leave a field oxide region over adjacent portions of said P-well and said N-well; and growing an additional oxide, which is thinner than said second oxide, over areas of said substrate which are exposed by said second oxide layer, and thereafter removing said additional oxide;

whereby said step of growing and removing said additional oxide removes damaged material.

14. The method of claim 13, wherein said substrate comprises silicon.

15. The method of claim 13, wherein said step of implanting P-type dopant atoms and said step of implanting additional P-type dopant atoms use approximately the same energy.

16. The method of claim 13, wherein said heating step forms said P-well region to have a depth approximately equal to the depth of said N-well.

17. The method of claim 13, wherein said step of growing said first oxide layer comprises the preliminary substeps of depositing a silicon nitride layer, and etching said silicon nitride to expose said selected portion.

18. The method of claim 13, wherein said step of etching said second oxide layer uses anisotropic etching.

19. An integrated circuit fabricated by the method of claim 13.

20. A method of forming a semiconductor integrated circuit structure, comprising the steps of:

forming N-well and P-well regions in a substantially monolithic substrate;

implanting additional P-type dopant atoms, into said P-well regions only, to form a surface region therein having a dopant concentration higher than said first dopant concentration;

uniformly growing a field oxide layer;

patterning and etching said field oxide layer to leave field oxide regions over portions of said P-well and said N-well regions;

and thereafter growing an additional oxide, which is thinner than said second oxide, over areas of said substrate which are exposed by said second oxide layer, and thereafter removing said additional oxide;

whereby said step of growing and removing said additional oxide removes damaged material.

21. The method of claim 20, wherein said substrate comprises silicon.

22. The method of claim 20, wherein said P-well regions have a depth approximately equal to the depth of said N-well regions.

23. An integrated circuit fabricated by the method of claim 20.

24. A method of forming a semiconductor integrated circuit structure, comprising the steps of:

forming N-well and P-well regions in substantially monolithic semiconductor material;

growing a field oxide layer;

patterning and etching said field oxide layer to leave field oxide regions over portions of said P-well and said N-well regions;

and thereafter growing an additional oxide, which is thinner than said field oxide layer, over areas of said substrate which are exposed by said field oxide layer, and thereafter removing said additional oxide;

whereby said step of growing and removing said additional oxide removes damaged material.

25. The method of claim 24, wherein said substrate comprises silicon.

26. The method of claim 24, wherein said P-well regions have a depth approximately equal to the depth of said N-well regions.

27. An integrated circuit fabricated by the method of claim 24.

* * * * *